United States Patent [19]

Chen et al.

[11] 4,056,411

[45] Nov. 1, 1977

[54] METHOD OF MAKING MAGNETIC DEVICES INCLUDING AMORPHOUS ALLOYS

[76] Inventors: Ho Sou Chen, 3 Arrighi Drive, Warren, N.J. 07060; Ernst Michael Gyorgy, 6 Woodcliff Drive, Madison, N.J. 07940; Harry John Leamy, 480 Charnwood Road; Richard Curry Sherwood, 8 Vista Lane, both of, New Providence, N.J. 07974

[21] Appl. No.: 686,456

[22] Filed: May 14, 1976

[51] Int. Cl.$^2$ .................. H01F 1/00; C22B 43/00
[52] U.S. Cl. ........................ 148/121; 148/31.57; 148/101; 148/108; 75/134 F; 75/170; 75/122; 75/124; C04B/35/00
[58] Field of Search ............ 148/121, 100, 101, 105, 148/108, 31.57, 120; 75/170, 134 F, 122, 124, 123 B, 128 R, .5 AA; 264/180

[56] References Cited

U.S. PATENT DOCUMENTS

| 3,820,040 | 6/1974 | Berry et al. | 148/108 |
|---|---|---|---|
| 3,845,805 | 11/1974 | Kavesh | 264/180 |
| 3,856,513 | 12/1974 | Chen et al. | 75/122 |

FOREIGN PATENT DOCUMENTS

| 2,126,687 | 12/1972 | Germany | 75/.5 AA |

OTHER PUBLICATIONS

Berry, B. et al., *Obtaining a Hard Magnetic Array*, in IBM Tech. Disc. Bul., Sept. 1973 pp. 1191–1192.
Polk, D. et al., *Formation and Properties of Glassy Ni-Fe Alloys*, in Jour. Non-Crys. Soc., 15, Jan. 1974, pp. 165–173.
Chen, H. et al., *Centrifugal Spinning Metallic-Glass Filaments*, in Materials Research Bull., Nov. 1976 pp. 49–54.

Primary Examiner—Walter R. Satterfield

[57] ABSTRACT

The disclosed magnetic devices, including a magnetically coupled conducting path, incorporate amorphous, low magnetostriction alloys of the general formula $(Co_aFe_bT_c)_iX_j$, the "metallic" constituents thereof being within the parenthetical expression. T, in the formulation, is selected from among Ni, Cr, Mn, V, Ti, Mo, W, Nb, Zr, Pd, Pt, Cu, Ag and Au, X being at least one "glass former" selected from among P, Si, B, C, As, Ge, Al, Ga, In, Sb, Bi and Sn. The "metallic" constituents comprise from 70–90 atomic percent of the alloy with cobalt being present in an amount of at least 70 atomic percent of the "metallic" constituents. The described material is prepared by rapid cooling from the liquid, directly to the shape needed for fabrication of the device (e.g., tape to be wound to form an inductor core). When the amorphous material is fabricated to its finished geometry, raised to a temperature somewhat below its crystallization temperature and quenched in a high heat of vaporization liquid (e.g., water), the permeability is greatly improved. An exemplary alloy was shown to possess properties, in some respects, equivalent to those of Supermalloy, an alloy of much more complex manufacture.

2 Claims, 2 Drawing Figures

METHOD OF MAKING MAGNETIC DEVICES INCLUDING AMORPHOUS ALLOYS

BACKGROUND OF THE INVENTION

1. Field of the Invention

The invention is in the field of electromagnetic devices using soft magnetic materials.

2. Brief Description of the Prior Art

Many metallic alloys have been produced in amorphous (non-crystalline) form by such methods as rapid cooling from the melt. These amorphous alloys have markedly different magnetic and mechanical properties from crystalline alloys of similar composition. Among these amorphous alloys are various nickel containing, iron containing and cobalt containing alloys, which include glass formers such as phosphorous and boron. (See, for example, *Journal of Non-Crystalline Solids*, 15 (1974) 165–178, "Amorphous Magnetism" H. O. Hooper and A. M. de Graaf, 1973, Plenum Press, New York, pp. 313-320; U.S. Pat. No. 3,838,365, Sept. 24, 1974 issued to M. Dutoit.) Various workers have studied the mechanical, electrical, magnetic, and acoustic properties of such amorphous materials. The characterization of these materials as amorphous is borne out by X-ray scattering measurements which do not show the sharp scattering peaks characteristic of crystalline materials. This characterization is particularly appropriate when considering the magnetic properties of these materials since the X-ray characteristic length is much smaller than distances characteristic of magnetic ordering phenomena. These materials have also been found to possess many of the thermodynamic properties of glasses. Many investigators are currently searching to find amorphous alloys with useful properties.

SUMMARY OF THE INVENTION

It has been found that certain cobalt rich amorphous alloys possess low magnetostriction along with high electrical resistance and excellent soft magnetic properties. These materials are produced directly in the filamentary form needed for the fabrication of many classes of magnetic devices so that it is not necessary to go through the many metallurgical processing steps needed to reduce ingots to the wire or tape form required for these devices. When the wire or tape is wound to final geometry, raised to a temperature below its crystallization temperature but above its Curie temperature and immediately quenched in a high heat of vaporization liquid (e.g., water), the permeability is greatly improved. An exemplary alloy was shown to possess properties, in some respects, equivalent to those of Supermalloy, an alloy of much more complex manufacture.

The subject materials are cobalt rich, cobalt-iron based alloys including a total of from 10 to 30 atomic percent of "glass formers", the glass forming group consisting of P, Si, B, C, As, Ge, Al, Ga, In, Sb, Bi and Sn. The cobalt-iron "metallic" portion can also include up to approximately 25 percent of a species selected from Ni, Cr, Mn, V, Ti, Mo, W, Nb, Zr, Pd, Pt, Cu, Ag, Au. For each value of the total proportion of "metallic" constituents there is a narrow band of compositions which defines the range of low magnetostriction compositions. This band may vary as the amount of "metallic" constituent varies with respect to the amount of glass forming constituent.

DETAILED DESCRIPTION OF THE INVENTION THE MATERIALS

A class of low magnetostrictive amorphous alloys of excellent soft magnetic properties has been found within the composition range represented by $(Co_aFe_bT_c)_iX_j$; with $0.7 \leq a \leq 0.97$, $0.03 \leq b \leq 0.25$ and $a + b + c = 1$. The elements within the parenthesis can be called the "metallic" constituents which make up from 70 to 90 atomic percent of the alloy ($0.7 \leq i \leq 0.9$) and X is the "glass former" group, which make up the remainder. X is selected from P, Si, B, C, As, Ge, Al, Ga, In, Sb, Bi and Sn or a combination of these. T is selected from Ni, Cr, Mn, V, Ti, Mo, V, W, Nb, Zr, Pd, Pt, Cu, Ag, and Au or a combination of these. The subscripts $i$ and $j$ sum to 1. The limits on the content of "metallic" constituents approximately delimit the composition range within which low magnetostriction is obtainable. From 10 to 30 atomic percent of glass formers is needed to achieve sufficiently stable amorphous alloys.

The above materials can be produced in amorphous form, for example, by extremely rapid cooling from the melt, usually as thin foils or tapes. Glass formers specified above are known to be so operative in nickel-iron alloys (*Journal of Non-Crystalline Solids*, 15 (1974) 165–178). It has been found that similar proportions are effective as glass formers in the alloys considered here. Improved stability results from inclusion of at least one atomic percent of at least one element selected from P, Si, B, C, As and Ge together with at least one atomic percent of at least one element selected from Al, Ga, In, Sb, Bi and Sn.

Figure 1:
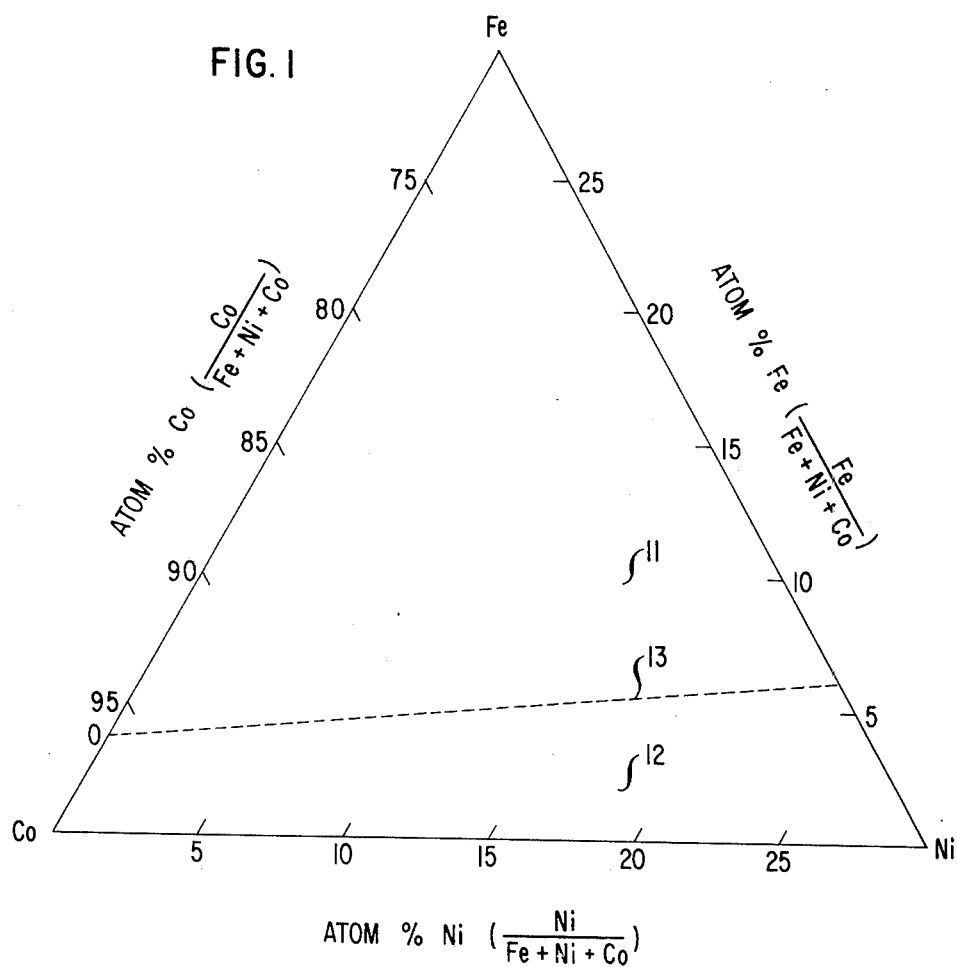
FIG. 1 is a ternary composition diagram showing the cobalt, iron, and nickel composition range within which exemplary low magnetostriction amorphous alloys fall.

FIG. 1 shows the composition range of magnetic constituents within which exemplary nickel containing low magnetostrictive amorphous alloys lie. The magnetostriction is observed to be positive in the upper portion 11 of this range and negative in the lower portion 12. The dashed line 13 indicates the approximate position of optimum low magnetostrictive amorphous alloys for nickel containing alloys with approximately 25 atomic percent of glass forming constituents and 75 atomic percent "metallic" constituents. Within plus or minus one-half atomic percent in iron composition, the magnetostrictive effect is less than 10 percent of the magnetostrictive effect observed well away from the line. Variation of cobalt or nickel composition is at constant iron content somewhat less restricted since the change produced is nearly parallel to the line 13. For a composition made with an iron content within 0.1 atomic percent of the line, no magnetostrictive effect was observed on the same apparatus as was used to make the other measurements. This line 13 approximately describes the position of low magnetostriction for alloys "metallic" material content within plus or minus 5 atomic percent of the above mentioned 75 atomic percent quantity. The location of this line 13 was determined by experimental data reported in Table 1. The alloys measured can be represented by the formula $(Co_aFe_bNi_c)_{0.75}P_{0.16}B_{0.06}Al_{0.03}$.

TABLE I

| Sample | Composition | Glass transition or crystallization temperature | Change of magnetization for given stress | Amorphous to x-ray | Curie temperature |
|---|---|---|---|---|---|
| 1 | $(Co_{.9}Fe_{0.1})_{.75}P_{.16}B_{.06}Al_{.03}$ | ~760° K | +15% | yes | 657° K |
| 2 | $(Co_{.95}Fe_{.05})_{.75}P_{.16}B_{.06}Al_{.03}$ | ~756° K | +7% | yes | 642° K |
| 3 | $(Co_{.96}Fe_{.04})_{.75}P_{.16}B_{.06}Al_{.03}$ | ~757° K | 0 | yes | 640° K |
| 4 | $(Co_{.98}Fe_{.02})_{.75}P_{.16}B_{.06}Al_{.03}$ | ~759° K | −18.5% | yes | 633° K |
| 5 | $Co_{.75}P_{.16}B_{.06}Al_{.03}$ | ~763° K | −35% | yes | 630° K |
| 6 | $(Co_{.72}Fe_{.08}Ni_{.2})_{.75}P_{.16}B_{.06}Al_{.03}$ | ~743° K | +8% | yes | 565° K |
| 7 | $(Co_{.76}Fe_{.04}Ni_{.2})_{.75}P_{.16}B_{.06}Al_{.03}$ | ~743° K | −29% | yes | 560° K |

PRODUCTION OF AMORPHOUS ALLOYS

Amorphous alloys have been produced by several methods involving rapid cooling of thin sections of the molten material. Some techniques involve the injection of a thin stream of liquid into a cooling bath, others involve contact of a thin portion of liquid with a cool solid. The latter techniques have been characterized under the general description of "splat cooling." Among these techniques are the piston and anvil technique and techniques involving the dropping of a portion of liquid between two counterrotating rollers (H. S. Chen and C. E. Miller, *Reviews of Scientific Instruments*, 41 (1970) 1237) or the injection of a thin stream of liquid between counterrotating rollers, such as in the apparatus pictured in U.S. Pat. No. 3,732,349 issued May 8, 1973 to Ho-Sou Chen et al. Amorphous metals have also been produced by vapor deposition or electrolytic deposition on a cooled surface.

In materials produced by the techniques described above, the extent or absence of crystalline ordering is investigated by such techniques as X-ray and electron beam scattering. These techniques, applied to the materials under consideration here, have shown no significant crystalline ordering over a greater than approximately 20 Angstroms range. Since magnetic ordering takes place with a characteristic length of the order of 1000 Angstroms, these materials show no crystalline ordering which can be seen by the magnetic system and, thus, can be classified as amorphous for purposes of magnetic description.

MATERIAL PROPERTIES

Figure 2:
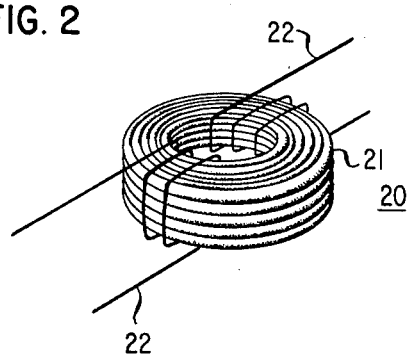
FIG. 2 is a perspective view of an exemplary electromagnetic device.

Soft magnetic materials with high electrical resistivity are required for the production of electromagnetic devices, such as inductors or transformers as pictured in FIG. 2. In FIG. 2 a transformer consists of a magnetic core 20 and conducting windings 22. The core 20 is wound from a long thin wire or tape 21 of an amorphous magnetic alloy.

Properties of importance in such devices include high initial permeability, high remanence and low coercivity. Amorphous magnetic material in the above-described composition range has been produced whose properties approach or meet the properties of conventional crystalline Supermalloy. The achievement of low coercivity is usually related to the achievement of a material possessing low magnetostriction. In addition, low magnetostriction is desirable for the production of devices whose properties are insensitive to mechanical stress during fabrication and varying thermomechanical stress during use. These materials have resistivities of the order of 200μ ohm centimeters which is an order of magnitude higher than the resistivities of permalloy materials.

It is known that the initial permeability of many magnetic materials is critically dependent on the thermal history of the materials during various stages of manufacture. In particular, Supermalloy, a material known and used for its high initial permeability, undergoes a closely controlled program of final cooling to develop its excellent magnetic properties. The materials of the invention, by contrast, have been shown to develop their high initial permeability properties upon a final quenching treatment. The material is fabricated to its final geometry (e.g., by winding the desired length of material on a bobbin to form an inductor or transformer core), raised to a temperature above the Curie temperature but below the glass transition temperature and quenched in a high heat of vaporization liquid, such as water.

The required residence time at the heat treatment temperature is somewhat temperature dependent, since the suggested physical phenomenon is diffusion related. Higher temperatures require shorter times. However, the difference between the Curie temperature and the glass transition temperature for these materials (See Table I), is small relative to the activation energy for ionic diffusion, so that over the composition range of interest, a residence time of 10 minutes is sufficient. Times as short as 1 minute are sufficient for most of the materials. The temperature must not be above the glass transition temperature so as not to destroy the amorphous nature of the alloy.

The requirement that a liquid possessing a high heat of vaporization be used for the quench is related to the need to rapidly cool the material down through the temperature range between the Curie temperature and that lower temperature, below which diffusion is so slow as to be insignificant (typically 100° C) so that there can be no preferential atomic ordering as the material cools. Water is particularly advantageous because of its high heat of vaporization and because it is otherwise easy to handle. Generally, liquids with at least half of the heat of vaporization of water are necessary in order to achieve the required rapid cooling rate in all but the smallest of devices.

EXAMPLES

The samples reported in Table I were produced by injecting a stream of molten metal of the desired composition into the contact area of two counterrotating cool rollers, from a fused silica tube with a 200 micrometer diameter opening. The liquid was forced from the tube by imposing a ~ ½ atmosphere overpressure of Ar gas on the upper surface of the liquid. The apparatus was similar to the apparatus pictured in U.S. Pat. No. 3,732,349 issued May 8, 1973 to Ho-Sou Chen et al. The rollers were 5 cm in diameter and rotating at a rate of 1000 revolutions per minute. The amorphous alloy was produced in the form of a tape 3 millimeters wide and approximately of 50 micrometers thick.

Metallic glass tapes approximately 25μm thick were produced by a spinning apparatus as described in Ho- Sou Chen et al, *Material Research Bulletin*, 11 (1976) 49 from two molten compositions. Composition I was $(Co_{0.96} Fe_{0.04})_{0.75} P_{0.16} B_{0.06} Al_{0.03}$. Composition II was $(Co_{0.74} Fe_{0.06} Ni_{0.2})_{0.75} P_{0.16} B_{0.06} Al_{0.03}$. Samples of both compositions were wound on bobbins, heat treated for approximately 10 minutes and quenched in water at room temperature. Composition I was heat treated at 700° K. Composition II was heat treated at 640° K. Table II shows the results of measurements of initial permeability of the two glass alloys both before and after heat treatment and the initial permeability of Supermalloy. The measurements were made at the indicated frequencies and magnetic fields. The Table indicates an improvement of initial permeability of, typically, more than a factor of four and results that approach or exceed those for Supermalloy.

TABLE II

| Frequency (Hz) | Magnetic Field (Gauss) | Permeability Alloy I As Produced | Alloy I Rapid Cool | Alloy II As Produced | Alloy II Rapid Cool | Supermalloy |
|---|---|---|---|---|---|---|
| 100 | 20 | $3.2 \times 10^3$ | $15 \times 10^3$ | $2.8 \times 10^3$ | $12.5 \times 10^3$ | $67.5 \times 10^3$ |
| 100 | 100 | | 19 | 6.6 | 23.4 | 72.0 |
| 100 | 1000 | | 68 | 20.8 | 89.3 | 120.0 |
| 1000 | 20 | | | 3.0 | 12.7 | 63.0 |
| 1000 | 100 | | | 5.8 | 18.8 | 65.0 |
| 1000 | 1000 | | | 14.2 | 89.3 | 89.0 |
| 10000 | 20 | | | 3.0 | 12.9 | 42.0 |
| 10000 | 100 | | | 4.3 | 15.0 | 43.0 |
| 10000 | 1000 | | | — | — | 45.0 |

What is claimed is:

1. Method for the production of a device comprising
   a. forming a filament consisting essentially of an amorphous low magnetostrictive metallic alloy of the composition $(Co_a Fe_b T_c)_i X_j$ wherein
      i. T is at least one first species selected from the group consisting of Ni, Cr, Mn, V, Ti, Mo, W, Nb, Zr, Pd, Pt, Cu, Ag, Au;
      ii. X is at least one second species selected from the group consisting of a first subgroup, consisting of P, Si, B, C, As and Ge and a second subgroup consisting of Al, Ga, In, Sb, Bi and Sn;
      iii. $i$ is from 0.7 to 0.9;
      iv. $i + j = 1$;
      v. $a$ is from 0.7 to 0.97; and
      vi. $b$ is from 0.03 to 0.25 with $a + b + c = 1$,
   b. winding the filament to produce a magnetic body,
   c. heat treating the magnetic body at a heat treatment temperature above its Curie temperature and below its glass transition temperature for at least one minute, which heat treatment temperature is selected to yield a body of improved magnetic permeability,
   d. immediately immersing the body in a liquid, and
   e. incorporating the body in the device by a method including magnetically coupling the body to an electrically conductive path.

2. Method of claim 1 in which the liquid is water.

UNITED STATES PATENT AND TRADEMARK OFFICE
CERTIFICATE OF CORRECTION

PATENT NO. : 4,056,411
DATED : November 1, 1977
INVENTOR(S) : Ho S. Chen, Ernst M. Gyorgy, Harry J. Leamy and Richard C. Sherwood It is certified that error appears in the above-identified patent and that said Letters Patent are hereby corrected as shown below:

On the cover page after the inventors' names, add
--Assignee: Bell Telephone Laboratories, Incorporated, Murray Hill, New Jersey.--.

Signed and Sealed this

Thirtieth Day of May 1978

[SEAL]

Attest:

RUTH C. MASON
Attesting Officer

LUTRELLE F. PARKER
Acting Commissioner of Patents and Trademarks